United States Patent
Liu et al.

(10) Patent No.: US 6,238,996 B1
(45) Date of Patent: May 29, 2001

(54) METHOD OF FORMING A SHALLOW TRENCH ISOLATION STRUCTURE

(75) Inventors: Guan-Jiun Liu, Chang-Hua Hsien; Shih-Ching Chen, Nantou Hsien; Chi-Jui Sung, Hsinchu; Chung-Po Hsu, Taipei Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/236,951

(22) Filed: Jan. 25, 1999

(30) Foreign Application Priority Data

Aug. 24, 1998 (TW) .................................................. 87113896

(51) Int. Cl.⁷ .................................................... H01L 21/76
(52) U.S. Cl. .......................................... 438/400; 438/424
(58) Field of Search ..................................... 438/400, 424, 438/427, 433, 692, 296, 359, 432, 782

(56) References Cited

U.S. PATENT DOCUMENTS

| | | | |
|---|---|---|---|
| 5,801,082 | * | 9/1998 | Tseng .................................... 438/424 |
| 6,057,208 | * | 5/2000 | Lin et al. .............................. 438/424 |
| 6,060,370 | * | 5/2000 | Hsia et al. ............................ 438/424 |
| 6,071,792 | * | 6/2000 | Kim et al. ............................ 438/424 |
| 6,107,159 | * | 8/2000 | Chuang ................................. 438/432 |

* cited by examiner

Primary Examiner—David Nelms
Assistant Examiner—Phuc T. Dang
(74) Attorney, Agent, or Firm—Jiawei Huang; J.C. Patents

(57) ABSTRACT

This invention provides a concave shallow trench isolation structure, and a fabricating method of a shallow trench isolation structure with concave bottom corners. The concave shape of the structure prevents stress centralization, and avoids leakage current or punch through in the source/drain regions.

8 Claims, 4 Drawing Sheets

METHOD OF FORMING A SHALLOW TRENCH ISOLATION STRUCTURE

CROSS-REFERENCE TO RELATED APPLICATION

This application claims the priority benefit of Taiwan application serial no. 87113896, filed Aug. 24, 1998, the full disclosure of which is incorporated herein by reference.

BACKGROUND OF THE INVENTION

1. Field of the Invention

This invention relates to a method of forming a shallow trench isolation structure, and more particularly to a method of avoiding stress centralized in the device active regions of fabricating the shallow trench isolation structure.

2. Description of the Related Art

An isolation region is formed in an integrated circuit for the purpose of separating neighboring device regions of a substrate and preventing the carriers from penetrating through the substrate to neighboring devices. In a dynamic random access memory (DRAM) device, for example, the field effect transistors (FETs) are isolated from each other by isolation regions in order to prevent current leakage among the FETs. Conventionally, local oxidation of silicon (LOCOS) technique is widely utilized in semiconductor industry to provide isolation regions among the various devices in the substrate. Since the LOCOS technique has been used for quiet a period of time, it is one of the most reliable and low cost methods for fabricating device isolation region. However, there are still some drawbacks of the LOCOS. The drawbacks include internal stress generation and bird's beak encroachment. For a high-integrated device, the problem of bird's beak encroachment by isolation regions is especially difficult to avoid, thus the isolation regions cannot effectively isolate devices.

Shallow trench isolation (STI) technique is the other conventional method of forming isolation regions. Shallow trench isolation is formed by first anisotropically etching to form a trench in the substrate, and then depositing oxide in the trench to form an isolation region. Since shallow trench isolation is scaleable and has no bird's break encroachment problem found in the conventional LOCOS technique, it become widely used for forming sub-micron CMOS circuits.

There are still some problems in the prior art of forming a shallow trench isolation structure, and these problems will be described in detail in accordance with FIGS. 1A–1B, which are schematics, cross-sectional views illustrating the formation of a shallow trench isolation structure in accordance with the prior art.

In FIGS. 1A, a pad oxide layer 102 and a silicon nitride mask layer 104 is formed on the substrate 100. A trench 106 is formed in the substrate 100 by removing portions of the silicon nitride layer 104, the pad oxide layer 102, and the substrate 100. Then, a liner oxide 108 is formed on the surface of the trench 106 in the substrate 100, and an insulating layer 110 is formed over the silicon substrate 100 to fill the trench 106 by atmospheric pressure chemical vapor deposition (APCVD). A densification step is performed at a high temperature to make the silicon oxide insulating layer 110 compact.

In FIG. 1B, chemical-mechanical polishing is performed while using the silicon nitride mask layer 104 as polishing stop layer to remove the excess insulating layer 110. Hot phosphoric acid solution is used to remove the silicon nitride mask layer 104 and to expose the pad oxide layer 102. An isolation region 112 is formed in the substrate 100 after the pad oxide layer 102 is removed with HF solution.

The angle between the sidewall and the bottom surface of the trench 106 is an obtuse angle, which means that the angle of the bottom corner 130 is larger than 90 degrees and smaller than 180 degrees. Stress is created in the bottom corner 130 of the trench 106 when the liner oxide layer 108 is formed and easily centralized in the device active regions 120 (shown in FIG. 1B) along the sidewall of the trench 106 because of the obtuse geometry of the bottom corner 130 in the trench 106.

During the densification step, since the crystal structure of the silicon substrate 100 experiences excessive compression or tension, the stress created while forming the liner oxide layer 108 is released to the single crystal structure substrate 100 to cause dislocations, which is one of the most common line defects. In addition to the high temperature densification step, dislocations are also created in the single crystal structure of silicon substrate 100 during the subsequent steps of forming source/drain regions. When dislocations extend to the source/drain regions, the dopants in the source/drain regions diffuse along the defect direction, and leakage current and/or punch through are created and the conductivity of devises is reduced. This phenomena becomes worse as the downsizing of devices and shortening of distance between devices, furthermore, it makes the device failure occur and lower the production yield.

SUMMARY OF THE INVENTION

It is therefore an object of the invention to provide an improved method of forming a shallow trench isolation structure to avoid stress centralization to solve the problems occur in the prior art, so as to prevent the dysfunction of devices.

To achieve these objects and advantages, and in accordance with the purpose of the invention, as embodied and broadly described herein, the invention is directed towards a method of forming a shallow trench isolation structure. A concave trench is formed in a single crystal substrate with a defined mask layer. The surface of the concave trench is smooth and without any sharp turning points. The concave trench is filled with insulating materials, and the mask layer is removed until the substrate is exposed, and a shallow trench isolation structure with a concave trench is formed.

A shallow trench isolation structure of a trench with concave bottom corners is disclosed in this invention, too. The surfaces of the concave bottom corners in the trench are smooth and without any sharp turning points. The shallow trench isolation structure is finished after the trench filled with insulating materials and the mask layer being removed.

Stress centralization is prevented by the structure of concave trench and a trench with concave bottom corners formed according to the methods of the first and the second preferred embodiments of this invention. The concave trench and the trench with concave bottom corners also avoid the creation of leakage current and/or the punch through phenomenon in the source/drain regions.

It is to be understood that both the foregoing general description and the following detailed description are exemplary and explanatory only and are not restrictive of the invention, as claimed.

DESCRIPTION OF THE PREFERRED EMBODIMENTS

The First Embodiment:

During the formation of a shallow trench isolation structure known in the prior art, defects are easily created as stress centralized in the device active regions along the sidewall of the trench. Leakage current is created by the diffusion of the dopants of the source/drain regions along the direction of defects during the formation of source/drain regions. A method of preventing stress centralization in the formation of shallow trench isolation structure is provided in the invention.

FIGS. 2A–2F are schematic, cross-sectional views illustrating the formation steps of a shallow trench isolation structure with a concave trench according to the first preferred embodiment of the invention.

Figure 1A:
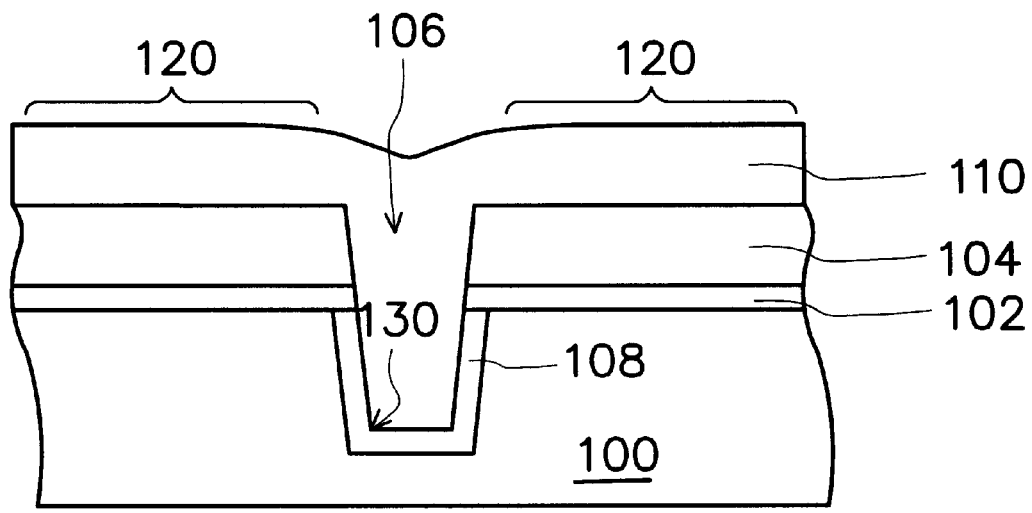
FIGS. 1A–1B are schematic, cross-sectional views illustrating the formation steps of a shallow trench isolation structure in accordance with a method known in the prior art.
Figure 1B:
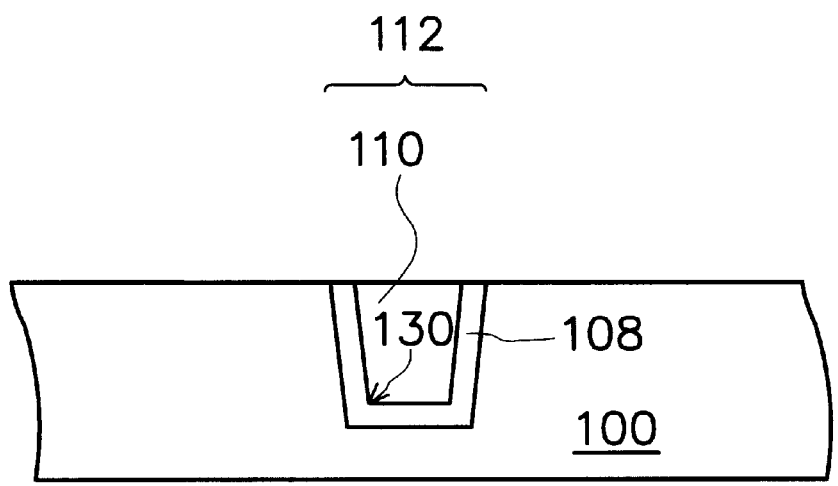
Figure 2A:
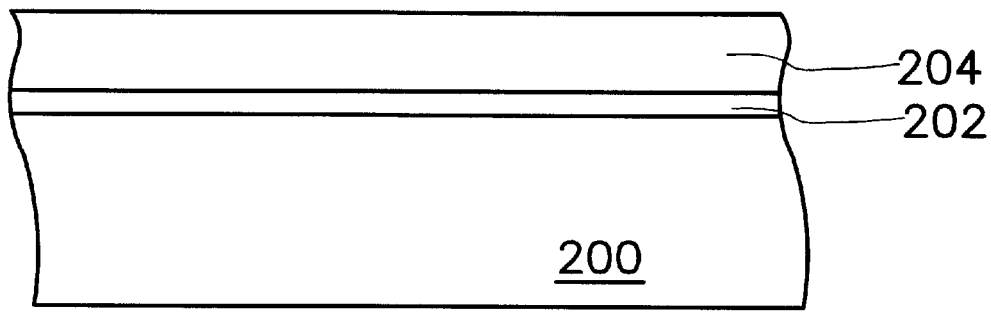
FIGS. 2A–2F are schematic cross-sectional views illustrating the formation steps of a concave shallow trench isolation structure with a concave trench according to the first preferred embodiment of the invention.

Referring to FIG. 2A, a substrate 200 with single crystal structure is provided, and a pad oxide layer 202 is formed on it. The pad oxide layer 202 is removed before the formation of a gate oxide in following steps. The substrate 200 is, for example, a semiconductor silicon substrate. Thereafter, a mask layer 204 is formed on the pad oxide layer 202 by chemical vapor deposition, for example. The mask layer is, for example, silicon nitrite. Then, a patterned photoresist layer (not shown in the figure) is formed on the mask layer 204.

Figure 2B:
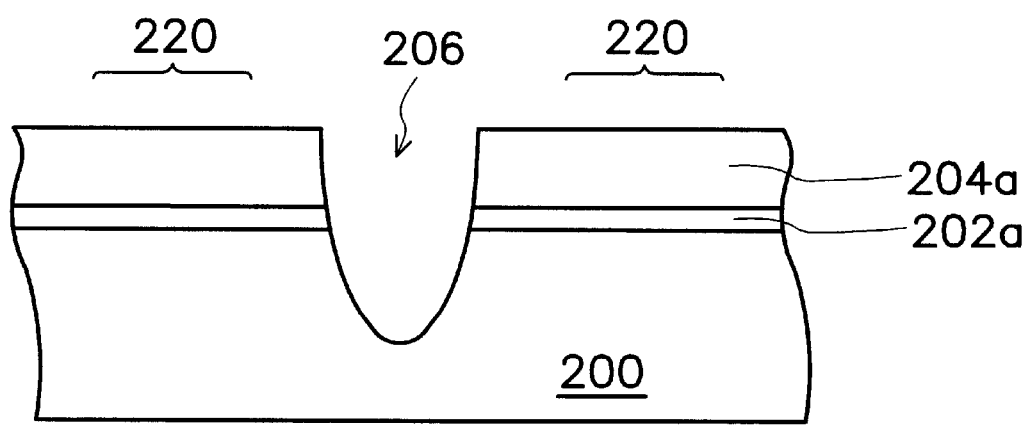

As shown in FIG. 2B, the photoresist layer is used as a mask and the mask layer 204 is etched to leave the mask layer 204a. Then, the pad oxide layer 202 and the substrate 200 are sequentially etched using the mask layer 204a as a mask to form a concave trench 206 in the substrate 200 and the pad oxide layer 202a is left. Next, the photoresist layer is removed so that a device active area 220 is defined. The concave geometry of the concave trench 206 is one characteristic of this invention, and the surface profile 212 of the concave trench 206 is smooth and without any sharp turning points. Stress will not be centralized in subsequent fabricating steps because of the concave geometry of the trench 206, and not extend to the device active regions as known in the prior art.

Figure 2C:
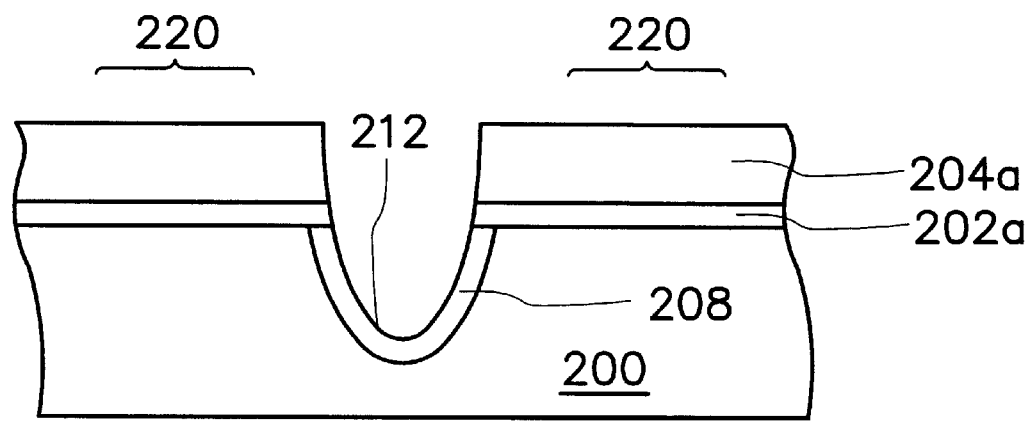

As shown in FIG. 2C, a liner oxide layer 208 is formed on the surface of the concave trench 206 in the substrate 200 by thermal oxidation, for example. The liner oxide layer 208 extends to contact with the pad oxide layer 202a at the top of the concave trench 206. Stress is created on the bottom of the concave trench 206 during the growth of the liner oxide layer 208. Because of the geometry of the concave trench 206, stress will not be centralized, and this avoids the creation of defects in the device active area 220 of the substrate 200. Thus, the extension of dislocations to the source/drain regions known in prior art is prevented, and the device active regions 220 on the substrate 200, still have a single crystal structure.

Figure 2D:
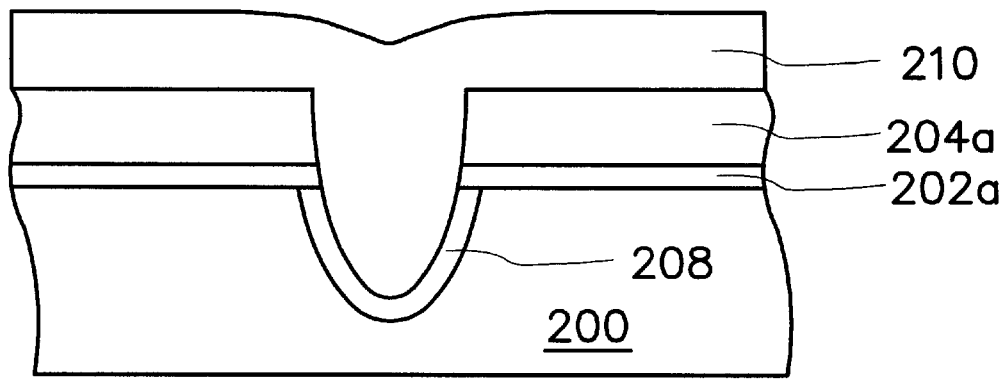

As shown in FIG. 2D, the concave trench 206 is overfilled with an insulating material such as oxide by atmospheric pressure chemical vapor deposition or low pressure chemical vapor deposition, for example. Then, the insulating material is densified to form an insulating layer 210. Densification is another step that creates stress. Because of the geometry of the concave trench 206, stress created in the densification will not be centralized in the device active regions 220 on the substrate 200, which has a single crystal structure. It is prevented that the phenomena of dislocations extending to the source/drain regions known in the prior art.

The concave trench 206 in this invention absolutely prevents the dopants from diffusing along the interface of dislocations in the formation of the source/drain regions, and prevents leakage or punch through in the source/drain regions. Thus, the conductivity and the yield of products are both enhanced because of the concave geometry of the concave trench 206, even when the devices are downsized.

Figure 2E:
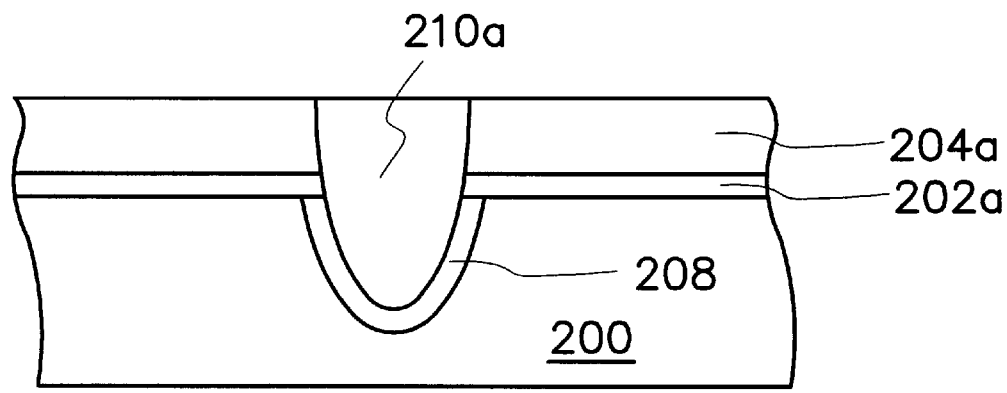

As shown in FIG. 2E, the excess insulating layer 210 on the mask layer 204a is removed by chemical mechanical polishing in which the mask layer 204a is the polish stop layer, for example, and the insulating layer 210a is left in the concave trench 206.

Figure 2F:
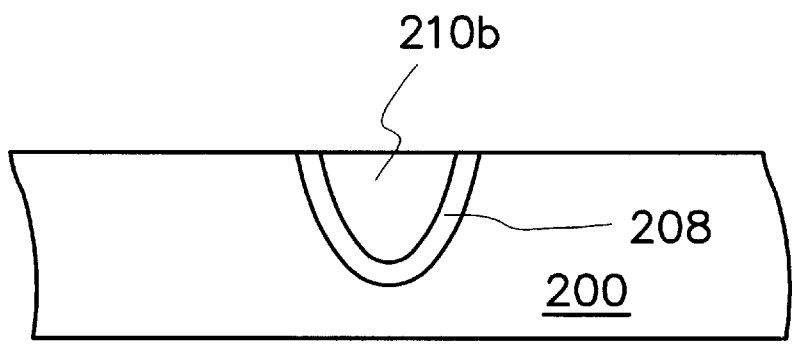

As shown in FIG. 2F, the mask layer 204a is removed with hot phosphoric acid solution, for example, and then the oxide layer 202a is removed. Portions of the insulating layer 210a are removed in the procedure of removing the oxide layer 202a and the shallow trench isolation structure 210b with a concave trench 206 is formed.

Figure 3A:
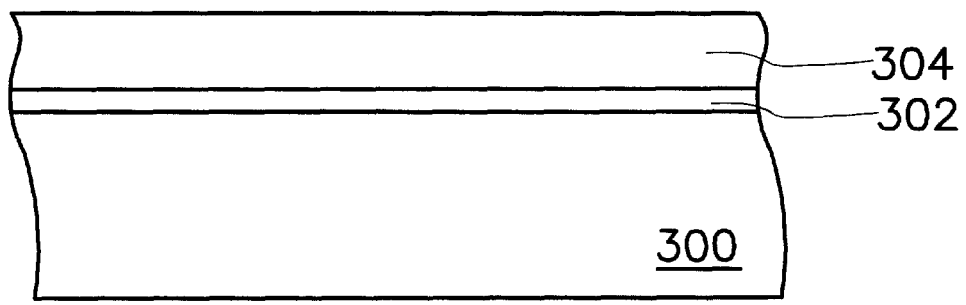
FIGS. 3A–3C are schematic, cross-sectional views illustrating the formation steps of a shallow trench isolation structure of a trench with concave bottom corners according to the second preferred embodiment of the invention
Figure 3B:
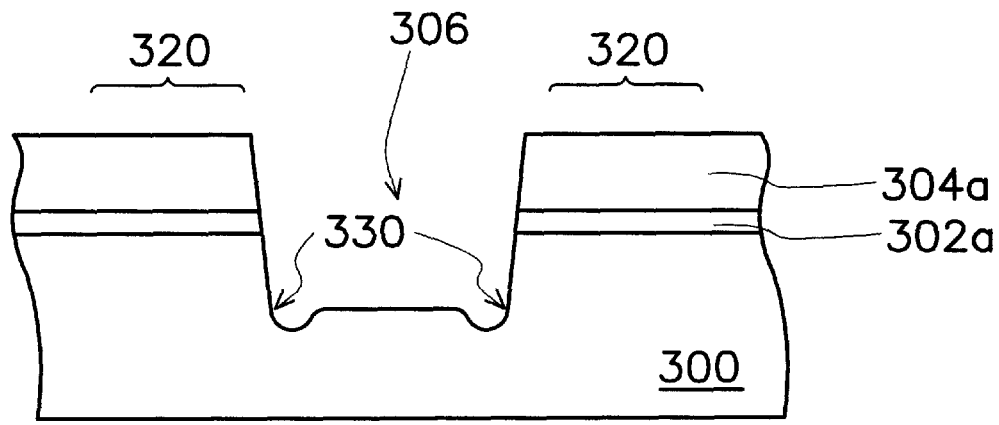
Figure 3C:
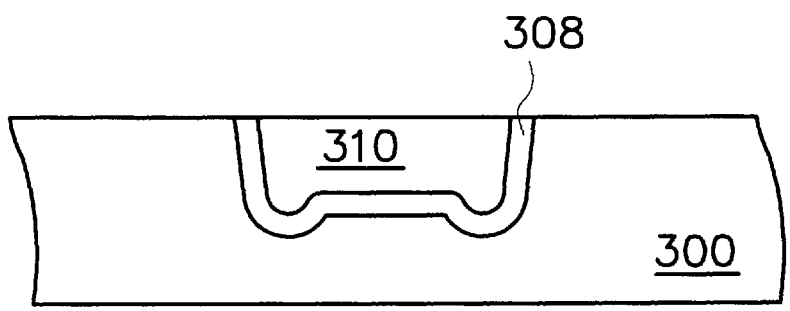

The Second Embodiment:

FIGS. 3A–3C are schematic, cross-sectional views illustrating the formation steps of a shallow trench isolation structure with a trench has concave bottom corners according to the second preferred embodiment of the invention, which is another way to prevent stress centralization.

As shown in FIG. 3A, a substrate 300 of single crystal structure, for example, semiconductor silicon substrate, is provided and a pad oxide layer 302 is formed on the substrate 300 to protect it. The pad oxide layer 302 is removed before the formation of the gate oxide in following steps. Then, a mask layer 304 is formed on the pad oxide layer 302 by chemical vapor deposition, for example, and a patterned photoresist layer (not shown in the figure) is formed on the mask layer 304. The mask layer 304 is, for example, silicon nitrite.

As shown in FIG. 3B, the photoresist layer is used as a mask while etching the mask layer 304 to leave the mask layer 304a. Then, the mask layer 304a is used as a mask, and the pad oxide layer 302 and the substrate 300 are sequentially etched to leave the pad oxide layer 302a and the trench 306 with concave bottom corners 330 is formed. Then, the photoresist layer is removed, so the device active regions 320 are defined. The device isolation structure, trench 306 with concave bottom corners 330, is one characteristic of this invention. There are two concave bottom corners 330 between the sidewall and bottom of the trench 306. The surfaces of the concave bottom corners 330 are smooth and without any sharp turning points. Stress will not be centralized in subsequent fabricating steps because of the concave geometry of bottom corners 330 of the trench 306, and stress does not extend to the active regions of devices 320 as known in the prior art.

Then, the same fabricating process as shown by the first embodiment and with reference to FIGS. 2C to 2F are performed to form the shallow trench isolation structure 310, which has concave bottom corners 330.

According to the embodiments mentioned above, the characteristics of this invention are the formation of a concave trench and a trench with concave bottom corners, so as to prevent stress centralization. Dislocations extending to the source/drain regions occured in prior art are not found in the method of forming a shallow trench isolation structure provided by this invention, and so leakage current or punch through in the source/drain regions is avoided, and furthermore, the product yield is enhanced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a shallow trench isolation structure, comprising:

providing a substrate;

forming a mask layer on the substrate;

forming a concave trench with a smooth surface profile by removing portions of the mask layer and the substrate, wherein there is not any sharp turning points along the surface of the concave trench;

filling the concave trench with an insulating material; and removing the mask layer until the substrate is exposed.

2. The method according to claim 1, comprising further a step of forming a pad oxide layer between the substrate and the mask layer.

3. The method according to claim 1, comprising further a step of forming a liner oxide layer on the surface of the concave trench before filling the concave trench with insulating material.

4. A method of forming shallow trench isolation structure, comprising:

providing a substrate;

forming a mask layer on the substrate;

forming a trench with two concave bottom corners which have a smooth surface profile in the substrate, wherein a bottom region of the trench between the two concave bottom corners is elevated at a level above the two concave bottom corners, and there is not any sharp turning points along the surface of the concave bottom corners;

filling the trench with an insulating material; and removing the mask layer until the substrate is exposed.

5. The method according to claim 4, comprising further a step of forming a pad oxide layer between the substrate and the mask layer.

6. The method according to claim 4, comprising further a step of forming a liner oxide layer on the surface of the trench before filling the trench with insulating material.

7. A method of avoiding stress centralization in fabrication of a shallow trench isolation structure, wherein the method is applicable to a substrate with a single crystal structure, comprising:

forming a concave trench in the substrate, wherein the concave trench has a smooth surface profile and there is not any sharp turning points along the surface; and filling the concave trench with an insulating material.

8. A method of avoiding stress centralization in the fabrication of a shallow trench isolation structure applicable to a substrate with a single crystal structure, comprising:

forming a trench with concave bottom corners in the substrate, wherein a bottom region of the trench between the two concave bottom corners is elevated at a level above the two concave bottom corners, and each of the concave bottom corners has a smooth surface without any sharp turning points along the surface of the concave bottom corners; and filling the trench with an insulating material.

* * * * *